United States Patent
Garg et al.

(10) Patent No.: US 7,973,681 B2
(45) Date of Patent: Jul. 5, 2011

(54) HIGH SPEED, LOW POWER NON-RETURN-TO-ZERO/RETURN-TO-ZERO OUTPUT DRIVER

(75) Inventors: Adesh Garg, Irvine, CA (US); Afshin Momtaz, Laguna Hills, CA (US); Namik Kocaman, San Clemente, CA (US); Delong Cui, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/567,841

(22) Filed: Sep. 28, 2009

(65) Prior Publication Data

US 2011/0074610 A1    Mar. 31, 2011

(51) Int. Cl.
*H03M 7/12* (2006.01)
(52) U.S. Cl. .......................... 341/69; 341/68
(58) Field of Classification Search .............. 341/50, 341/68, 69
See application file for complete search history.

(56) References Cited

U.S. PATENT DOCUMENTS

| | | | |
|---|---|---|---|
| 2005/0243454 A1* | 11/2005 | Igaki et al. | 360/39 |
| 2006/0285853 A1* | 12/2006 | Murai | 398/152 |
| 2007/0274732 A1* | 11/2007 | D'Errico et al. | 398/202 |
| 2008/0198939 A1* | 8/2008 | Nakasha et al. | 375/256 |
| 2009/0080465 A1* | 3/2009 | Yang et al. | 370/537 |

OTHER PUBLICATIONS

"A Novel 50-Gbit/s NRZ-RZ Converter with Retiming Function Using InP HEMT technology"; Toshihide Suzuki et al.; Fujitsu Laboratories Ltd.; CSIC 2005 Digest; 2005.

* cited by examiner

*Primary Examiner* — Peguy JeanPierre
(74) *Attorney, Agent, or Firm* — Garlick Harrison & Markison

(57) ABSTRACT

A gating logic receives a non-return-to-zero (NRZ) input signal and couples the NRZ input signal as an NRZ output signal when operating in a NRZ mode of operation and converts the NRZ input signal to a return-to-zero (RZ) output signal when operating in a RZ mode of operation. A circuit coupled to the gating logic receives a clock signal and couples the clock signal to the gating logic to convert the NRZ input signal to the RZ output signal in the RZ mode of operation. In the NRZ mode of operation, the circuit decouples the clock signal and places a predetermined signal state at the gating logic to pass through the NRZ input signal as the NRZ output signal. The circuit receives a select signal to select between the NRZ and RZ modes of operation and the NRZ and RZ modes are obtained by controlling the clock signal to the gating logic.

18 Claims, 6 Drawing Sheets

HIGH SPEED, LOW POWER NON-RETURN-TO-ZERO/RETURN-TO-ZERO OUTPUT DRIVER

BACKGROUND OF THE INVENTION

1. Technical Field of the Invention

The present invention relates generally to data communication and, more particularly, to output drivers utilized for data transfer.

2. Description of Related Art

A variety of output drivers are known in the art for driving data lines to transfer data. These devices are commonly referred to as output drivers, buffers, transmission drivers, bus drivers, or simply drivers, as well as other terms. High speed output drivers demand a significant portion of the overall transmitter power and tend to limit the overall performance of the entire transmission system. Typically, traditional output drivers are designed to operate with a single signaling scheme. Thus, when different communication standards are employed calling for different signaling schemes, a significant overhead may be required to meet this need.

New transmitter architectures allow a high speed output driver to operate in two popular signaling schemes or modes. One is a return-to-zero (RZ) signaling scheme and the other is a non-return-to-zero (NRZ) signaling scheme. When using traditional output drivers, separate drivers are employed, one for each scheme, if both NRZ and RZ capabilities are to be built into an integrated circuit chip. However, accommodating both NRZ and RZ schemes significantly increases chip overhead, when separate drivers are employed.

Thus, there is a need for an output driver that provides high speed data transfers in both NRZ and RZ output modes, but with reduced chip overhead to reduce power.

SUMMARY OF THE INVENTION

The present invention is directed to apparatus and methods of operation that are further described in the following Brief Description of the Drawings, the Detailed Description of the Invention, and the Claims. Other features and advantages of the present invention will become apparent from the following detailed description of the embodiments of the invention made with reference to the accompanying drawings.

DETAILED DESCRIPTION OF THE INVENTION

The embodiments of the present invention may be practiced in a variety of settings that utilize an output driver to transfer information, such as data. The output driver may drive a circuit, a wire, a bus, a transmission line or any other coupling or medium used for data transfer. The transfer may be short distance, such as within an integrated circuit or on a circuit board, or the transfer may be over a long distance, such as through a network. The output driver may be implemented using various technologies and may be integrated or discreet. The output driver may drive signals of various technologies, including optical transmissions, such as synchronous optical networking (SONET). The embodiments described below are for exemplary purpose and other embodiments may be readily implemented to practice the invention.

Figure 1:
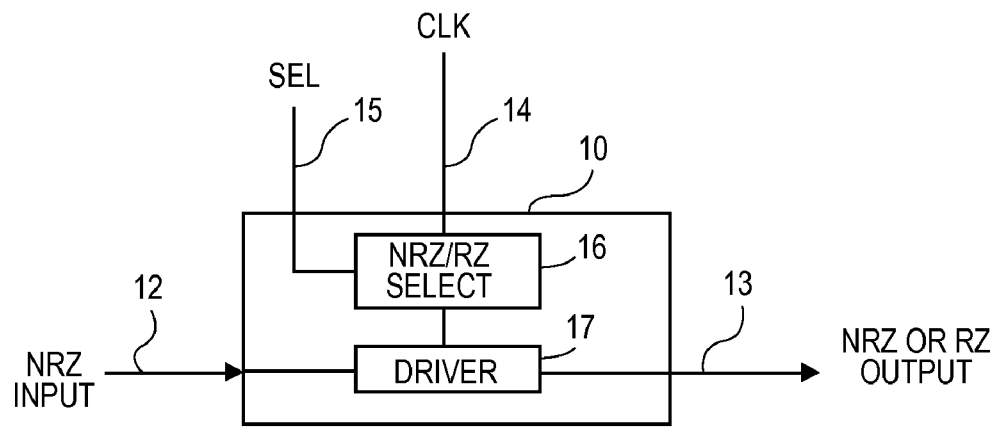
FIG. 1 is a block diagram showing an embodiment of an NRZ/RZ output driver of the present invention.
Figure 2:
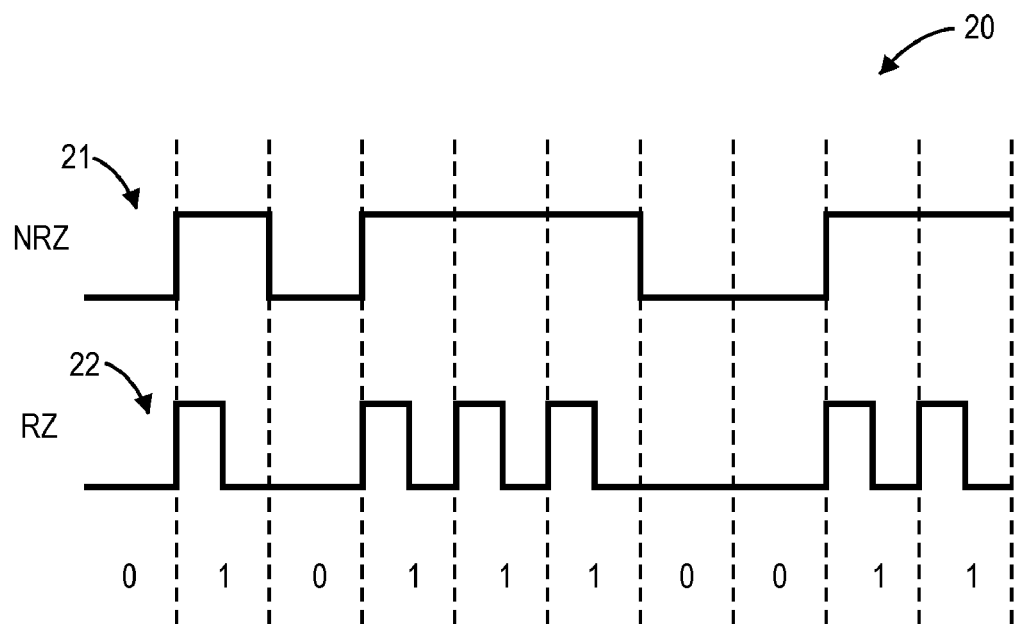
FIG. 2 is a signal diagram showing example outputs of the output driver of FIG. 1 in NRZ and RZ modes of operation.

FIG. 1 shows an embodiment of an output driver 10 of the present invention. Output driver 10 is coupled to receive an input 12, such as data input, in a non-return-to-zero (NRZ) format and provide an output 13, which may be either NRZ or return-to-zero (RZ) format. A distinction between NRZ and RZ is shown in diagram 20 of FIG. 2. In NRZ format, bit states of "1" and "0" are distinguishable based on the "high" or "low" state of a signal line as shown in signal diagram 21. In RZ format, the signal line always returns to a base state ("low" state in the example of FIG. 2), so that a bit state "1" (in positive logic) is noted by a single pulse and bit state "0" is noted by no pulse. Note that in RZ mode, the bit line always returns to the base state ("low" state in FIG. 2) as shown by signal diagram 22. The dotted vertical lines in FIG. 2 denote a clock cycle. The RZ pulses are shown having a duty-cycle of approximately 50% to coincide with a 50% half-cycle of a clock pulse. However, as will be discussed below, the invention allows for this duty cycle to be adjusted in the RZ mode.

Output driver 10 also receives an input clock signal 14, shown as CLK, to provide timing for a driver module 17. A select signal input 15, shown as SEL, is also coupled to a NRZ/RZ select module 16 of output driver 10 and is used to select between NRZ and RZ modes of operation. NRZ/RZ select module 17 controls operation of driver module 17 to either couple through the NRZ input as NRZ output or, alternatively, convert the NRZ input signal to an RZ output signal. The SEL signal may be generated by various means, including other circuitry integrated with output driver 10, obtained externally from chip, obtained as a programmable signal, or obtained in other ways. The SEL signal allows output driver 10 to be selectable in operating in one of two modes (e.g. NRZ and RZ). As will be described below, in one embodiment, the clock signal is coupled or decoupled from driver module 17 to select between RZ and NRZ modes of operation for the driver module 17.

Figure 3:
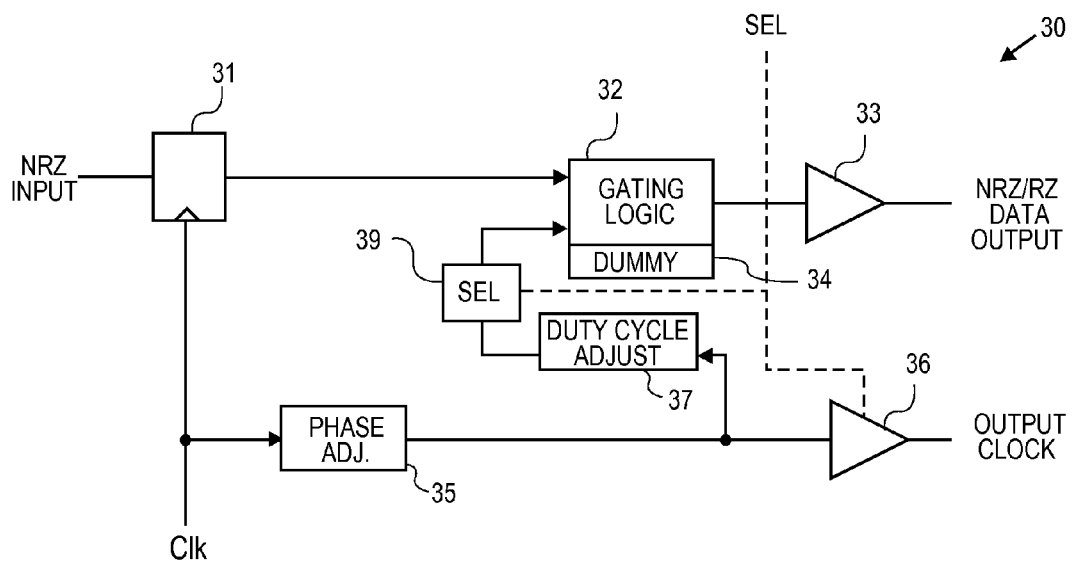
FIG. 3 is a block diagram of a more detailed NRZ/RZ output driver of FIG. 1.

Although output driver 10 of FIG. 1 may be implemented in various ways, one particular implementation is shown in an embodiment of FIG. 3. In FIG. 3, a driver circuit 30 is shown, in which driver circuit 30 may be used for output driver 10 of FIG. 1. An NRZ data signal input is coupled to a flip-flop 31, which is triggered by the input clock signal CLK. When coupled through, the NRZ data is coupled to a gating logic module (or circuit) 32, which output is then coupled to an output driving device 33 (which may be an amplifier, buffer, driver, etc.). In some embodiments, gating logic module 32 may contain a dummy logic circuit 34, such as the dummy AND gate described below in reference to FIGS. 4-6. In other embodiments, dummy logic circuit 34 may not be present.

The CLK signal is also coupled to a phase adjustment module 35 that adjusts the phase of CLK, when needed. The output from phase adjustment module 35 is a phase adjusted (or phase shifted) CLK signal. The phase shift introduced by phase adjustment module 35 may be fixed or variable. A variety of phase adjustment or phase shifted techniques may be implemented to adjust the phase of the CLK signal. In one embodiment described below in reference to FIGS. 4-6, a two step adjustment scheme is employed to introduce a pre-determined fixed delay followed by a variable phase shift. Essentially, the fixed delay provides a coarse adjustment setting and the variable phase shift provides the fine adjustment setting. It is to be noted that the phase adjustment provided by phase adjustment module 35 may be set through programming or adjusted dynamically during operation of driver 30. A purpose of allowing for phase adjust of the CLK signal is to account for circuit delay introduced in the data path through driver circuit 30, so that the data and the clocking signal are substantially phase synchronized at the gating logic module 32 to compensate for any phase skew between the data and the clock signal. It is to be noted that other embodiments may employ different devices or techniques to provide the phase adjustment. Still in other embodiments, phase adjustment module 35 may not be used at all.

The phase adjusted CLK signal is then coupled to an output driving device 36 (which may be an amplifier, buffer, driver, etc.) and to a duty cycle adjustment module 37. Because the clock signal CLK typically has a duty cycle of about 50%, the RZ pulse output (shown in signal diagram 22 of FIG. 2) will also have a similar duty cycle. However, by use of duty cycle adjustment module 37, the duty cycle of the CLK signal may be adjusted, so that the duty cycle of the RZ pulse (shown diagram 22) may be adjusted plus or minus from 50%. As will be described below, the CLK signal is applied to gating logic module 32 only during the RZ mode, so that duty cycle adjustment is used for the RZ output. It is to be noted that duty cycle adjustment module 37 may not be used in some embodiments where duty cycle adjustment is not used. The clock signal is subsequently coupled through a select module 39 to provide a clock signal path to gating logic module 32 when in the RZ mode. In the example embodiments described below, a clocking circuit (in way of a clock buffer) is used to control the clock signal path to gating logic module 32.

The SEL signal is shown coupled to select module 39 and driving device 36. In the NRZ mode, the SEL signal activates driving device 36 to output the phase adjusted CLK signal as a skew corrected clock signal. Also, in the NRZ mode, the SEL signal deactivates or switches select module 39 to decouple the clock signal from gating logic 32, while placing a predetermined signal state as an input to gating logic module 32. This predetermined signal state provides a set "logic" (such as logic "1") as an input to gating logic 32, instead of the clock signal, in order for the NRZ input to be coupled through gating logic module 32 to be output from driving device 33. These two outputs are coupled as NRZ data output and clock output from driver circuit 30.

In the RZ mode, the SEL signal deactivates driving device 36 and activates or switches select module 39 to provide a clock path for the clock signal to be coupled to gating logic 32. The phase adjusted and duty cycle adjusted clock signal is then used to gate the NRZ signal in gating logic module 32 to convert the NRZ data format to RZ data format, where cycling of the clock signal states causes the return-to-zero conversion of the NRZ input. The RZ data is output from driving device 33, while no clock signal is transmitted from driving device 36 in the RZ mode.

It is to be noted that in other embodiments for practicing the invention, the function of select module 39 and/or duty cycle adjust module 37 may be incorporated within gating logic module 32. Still in other embodiments, driving device 36 may be left activated at all times to generate the output clock in both RZ and NRZ modes. In that instance, SEL signal need not be coupled to driving device 36.

Figure 4:
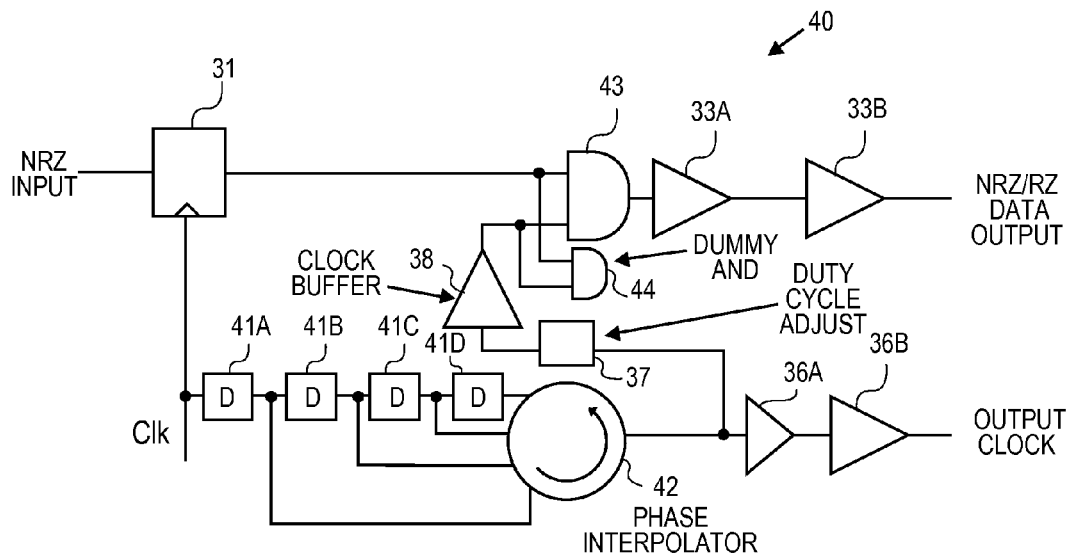
FIG. 4 is a block diagram showing one embodiment for implementing the NRZ/RZ output driver of FIG. 3.

Although driver circuit 30 may be implemented in various ways, one embodiment for the implementation of driver circuit 30 is shown as driver circuit 40 in FIG. 4. As shown in FIG. 4, phase adjustment module 35 of FIG. 3 is implemented as a series of delay elements 41 and a phase interpolator 42. For circuit 40, four delay elements 41A-D are used. The actual number or type of such delay elements may vary with other embodiments. Delay elements 41A-D, which may be simple gate delays in one embodiment, each introduces certain fixed delay in transitioning the CLK signal.

For driver circuit 40, phase interpolator 42 is used to provide the variable phase shift. A variety of phase interpolator circuits may be used, including those known in the art. Phase interpolator 42 introduces phase shift to the delayed CLK signal from delay elements 41A-D. In the shown embodiment, phase interpolator 42 introduces a set phase shift that may be set through an adjustment means, such as programming. The phase adjustment provided by phase interpolator 42 allows for fine phase adjustment of the delayed CLK signal, so that the clock signal is adjusted to gate the NRZ input data substantially near the center of a valid data period at the gating logic provided by AND gate 43. The clock phase adjustment is used where phase skew may exist between the NRZ input and the CLK signal. This phase adjustment corrects for any delay encountered by the data as it transitions through driver circuit 40, as well as providing phase adjustment for different data rates. The phase adjustment also allows for optimization of circuit performance across process, voltage and temperature (PVT) variations encountered in integrated circuits.

The shown embodiment uses delay elements 41A-D for coarse phase adjustment setting that is fixed and phase interpolator 42 for fine phase adjustment setting that may be varied. In other embodiments, there may only be one adjustment, either fixed or variable.

Driver circuit 40 implements an AND logic (logical AND), as shown by AND gate 43, to convert the NRZ input to a corresponding RZ output, when operating in the RZ mode. The NRZ input is coupled to one input of AND gate 43, while the CLK signal from a clock buffer 38 is coupled to a second input of AND gate 43. Clock buffer 38 is used as a clocking circuit to provide the function of select module 39 of FIG. 3, while also operating as a buffer for clock signal CLK. In one embodiment, clock buffer 38 is active in the RZ mode of operation to provide a path for the clock signal to AND gate 43. The NRZ data is coupled through AND gate 43 during "high" state of the buffered CLK signal (for positive logic) and the output of AND gate 43 returns to a "0" state when the buffered CLK signal goes "low" (for positive logic) when in the RZ mode. The gating of the NRZ data through AND gate 43 under control of the clock signal converts the NRZ data to RZ data. When duty cycle adjustment is employed, the duration of the "high" state of the buffered CLK signal determines the pulse duration of the "1" data for the RZ output. The RZ output is then coupled as the output from driver circuit 40.

When in the NRZ mode of operation, clock buffer 38 is deactivated to decouple the clock signal to AND 43. Instead of coupling the CLK signal, clock buffer 38 couples a fixed signal state as an input to AND gate 43. For example, if this fixed signal state is a logic "1" at the AND gate 43 input, then the NRZ signal at another input of AND gate 43 is coupled through to provide an NRZ output from AND gate 43. It is to be noted that in some embodiments, the function provided by clock buffer 38 may be included as part of AND gate 43 or as part of duty cycle adjustment module 37, so that clock buffer 38 may not be present at all.

Also shown in FIG. 4 is a dummy AND gate 44, which corresponds to dummy logic circuit 34 of FIG. 3. A purpose of dummy AND gate 44 is to provide symmetric or balanced loading of the clock signal and is further described with reference to FIG. 7. No output is generated from dummy AND gate 44. It is to be noted that although an AND gate is shown in circuit 40, a variety of other combinatorial logic may be implemented in other embodiments. The "AND" is a logical AND function, which may be implemented using various other gates and devices.

Furthermore, two separate drivers 33A-B are shown for driving device 33 of FIG. 3 and two separate drivers 36A-B are shown for driving device 36 of FIG. 3. Pairs of drivers are shown, but the actual number of such devices that may be used is a design choice.

Figure 5:
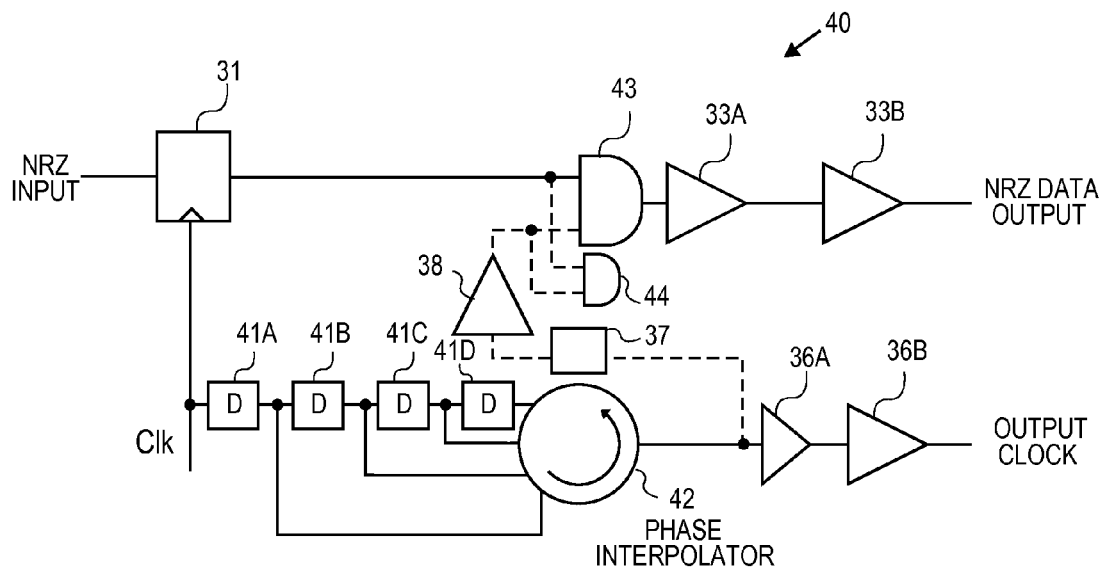
FIG. 5 shows the NRZ/RZ output driver of FIG. 4 in the NRZ output mode of operation.
Figure 6:
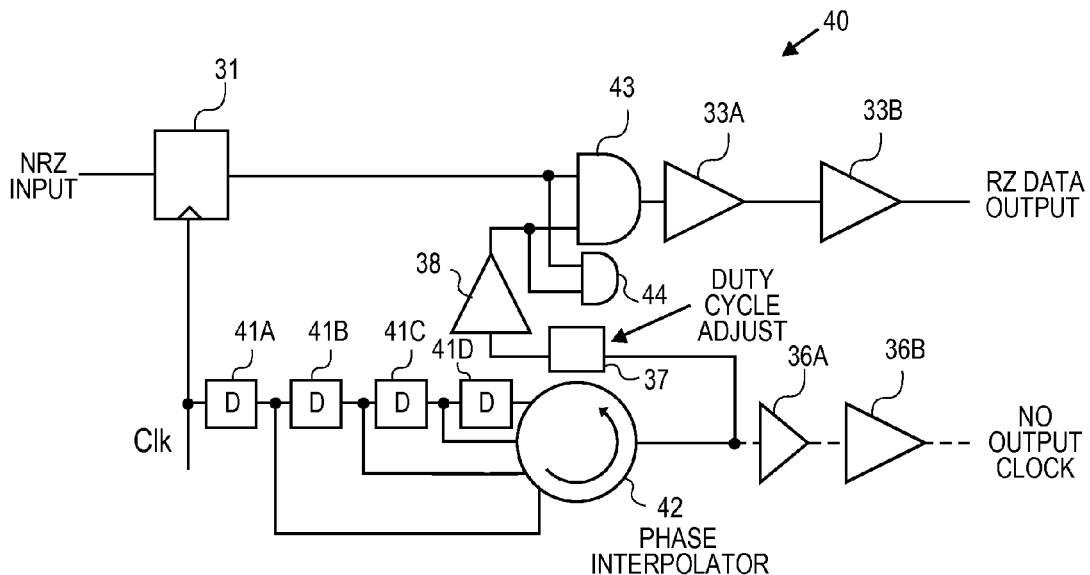
FIG. 6 shows the NRZ/RZ output driver of FIG. 4 in the RZ output mode of operation.

FIG. 5 shows driver circuit 40 when operating in the NRZ mode of operation and FIG. 6 shows driver circuit 40 when operating in the RZ mode of operation. In the NRZ mode of FIG. 5, the clock signal is output as a separate clock signal from drivers 36A-B, with the NRZ data being coupled through the drivers 33A-B. Thus, the buffered CLK signal is not needed at AND gate 43. The SEL signal, or some selection equivalent, decouples the clock signal path from interpolator 42 to AND gate 43 (as shown by the dotted lines). In one embodiment buffer clock 38 is deactivated by decoupling the clock signal and placing the line(s) coupled to AND gate 43 to a known state (such as logic "1"). In another embodiment, the decoupling of the clock signal from AND gate 43 may be achieved without actually deactivating clock buffer 38. Still in other embodiments, the function provided by clock buffer 38 may be incorporated in AND gate 43 and/or duty cycle adjustment module 37.

In circuit 40, decoupling of the CLK signal in the path containing clock buffer 38 results in the placement of a predetermined signal state at the buffer clock output. A predetermined "high" state places a logic "1" at the second input of AND gate 43, so that whatever logic state is present for the NRZ data at the first input of AND gate 43 is passed through AND gate 43 in the NRZ mode.

In the RZ mode shown in FIG. 6, the clock path through clock buffer 38 is active and the buffered CLK signal is coupled to the second input of AND gate 43. Since a separate clock signal is not needed at the output in the RZ mode, drivers 36A-B may be deactivated to prevent the separate output of the CLK signal. However, as noted above, in other embodiments, drivers 36A-B may remain active to output the CLK signal. Furthermore, it is to be noted that in the shown example embodiment, the same phase adjustment circuitry is used to adjust the skew of the CLK signal relative to the input NRZ data, whether in the NRZ mode or the RZ mode.

Figure 7:
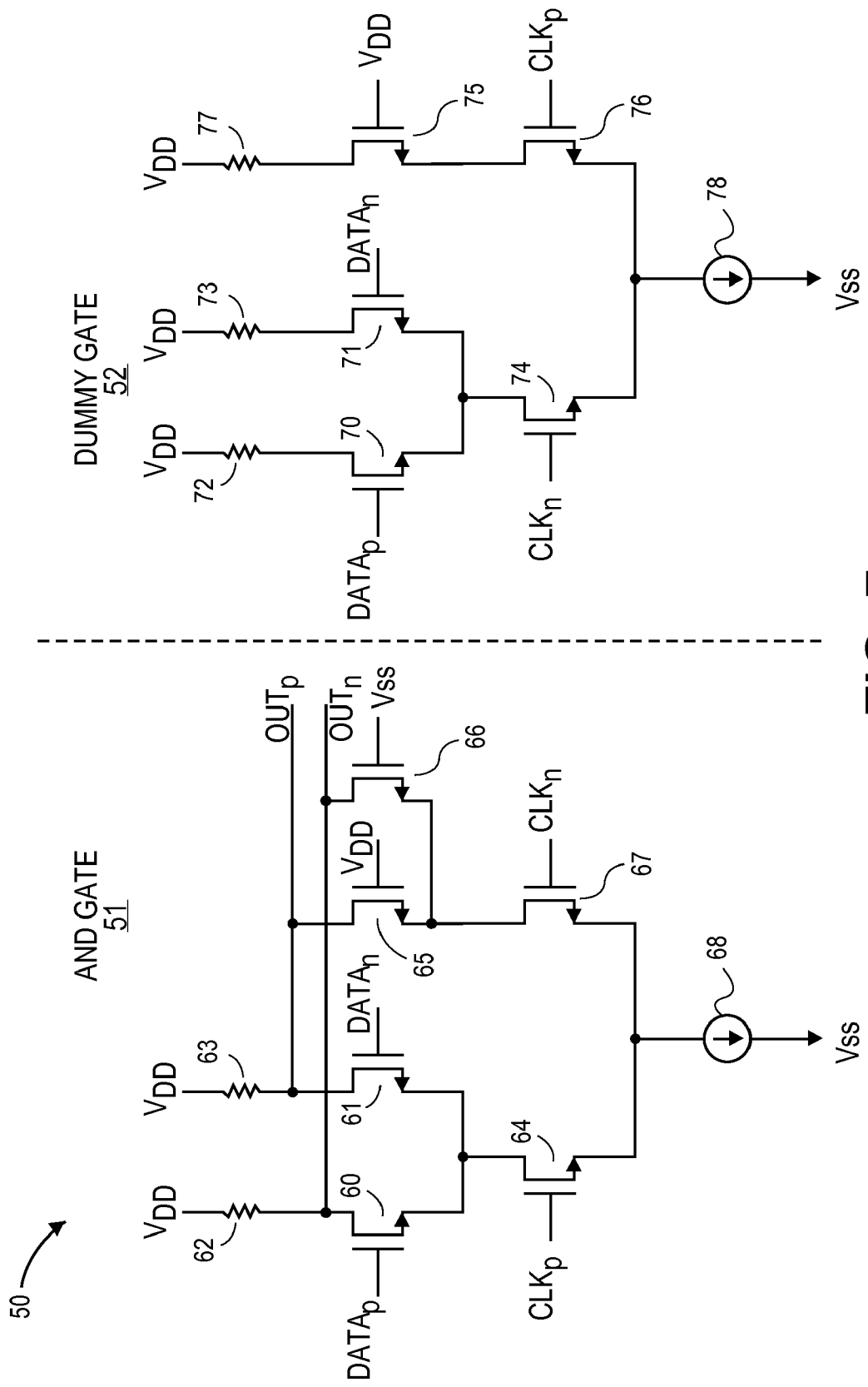
FIG. 7 is an example circuit schematic for implementing AND gating logic of FIGS. 4-6, in which a dummy gate circuit is also used for symmetrical balancing of the AND gate when generating the RZ output.

FIG. 7 shows a circuit schematic of a circuit 50 that is used to provide AND gating logic as described with driver circuit 40. Circuit 50 illustrates just one embodiment that may be implemented within driver circuit 40. Circuit 50 includes both an AND gate portion 51, that corresponds to AND gate 43 of circuit 40, and a dummy AND gate portion 52, that corresponds to dummy AND gate 44 of circuit 40. AND gate portion 51 comprises differentially arranged transistors 60, 61, with respective loads 62, 63, that have differential data inputs ($DATA_p$ and $DATA_n$) at the gates and outputs ($OUT_n$ and $OUT_p$) taken at the drains as shown; differentially arranged transistors 64, 67 with respective differential buffered clock inputs ($CLK_p$ and $CLK_n$) at the gates; transistor 65 coupled between $OUT_p$ and the drain of transistor 67; and transistor 66 coupled between $OUT_n$ and the drain of transistor 67.

As shown in FIG. 7, drains of transistors 60, 66, and 61, 65 are coupled to $V_{DD}$ through respective loads 62, 63; sources of transistors 60, 61 are coupled to the drain of transistor 64; sources of transistors 65, 66 are coupled to the drain of transistor 67; and sources of transistors 64, 67 are coupled to $V_{SS}$ via current source 68. Current source 68 is used in the common leg of the differential stage to maintain a substantially constant common current. The AND logic function is obtained by the operation of transistors of AND gate portion 51. When CLK is high ($CLK_p$ is high and $CLK_n$ is low), data $DATA_p$ and $DATA_n$ are correspondingly coupled as output $OUT_n$ and $OUT_p$. When CLK is low ($CLK_n$ is high and $CLK_p$ is low), transistors 65, 66 places a pre-determined state onto $OUT_n$ and $OUT_p$.

The $CLK_p$ and $CLK_n$ buffered differential clock inputs to the respective gates of transistors 64, 67 are obtained from the CLK signal, such as clock buffer 38 when used. As noted above, in the RZ mode, the clock inputs $CLK_p$ and $CLK_n$ from clock buffer 38 are active, but in the NRZ mode, the $CLK_p$ and $CLK_n$ are set to a predetermined fixed state, so that a logic "1" input is presented as an input to the AND gate 43. The NRZ input data, represented by differential data inputs $DATA_p$ and $DATA_n$ at respective gates of transistors 60, 61, are coupled through as differential outputs $OUT_n$ and $OUT_p$ in the NRZ mode or converted to differential RZ data outputs in the RZ mode, in response to the buffered clock signals $CLK_p$ and $CLK_n$. As noted above, buffered clock signals $CLK_p$ and $CLK_n$ may be phase adjusted, as well as duty cycle adjusted.

It is to be noted that transistors 65, 66 balance out the loading on the clock transistors 64, 67. Since the drain of transistor 64 has the loading of transistors 60, 61, transistors 65, 66 are provided at the drain of transistor 67 to provide similar loading, so that the circuit at both differential sides are balanced. In the particular embodiment, $V_{DD}$ is coupled to the gate of transistor 65 and $V_{SS}$ is coupled to the gate of transistor 66.

The particular schematic shown for the AND gate may vary in other embodiments. For example, transistors 65, 66 may not be present in other embodiments, in which the drain of transistor 67 would then be coupled to $OUT_p$. Still in another embodiment, the source of transistor 66 may be coupled to $V_{SS}$, instead of to the source of transistor 65. Still other example may be implemented. Furthermore, although certain circuit components and circuit configurations are shown, other embodiments may use different components and/or use different configurations. For example, although resistors are shown as loads coupled to drains of n-type transistors, p-type devices may be used as loads instead. Other embodiments may use other components.

Dummy gate portion 52 comprises differentially arranged transistors 70, 71, with respective loads 72, 73 that have differential data inputs ($DATA_p$ and $DATA_n$) at the gates; differentially arranged transistors 74, 76 with respective differential buffered clock inputs ($CLK_n$ and $CLK_p$) at the gates; and transistor 75 coupled between load 77 and the drain of transistor 76. The loads are coupled to $V_{DD}$ and the sources of clock transistors 74, 76 are coupled to $V_{SS}$ via current source 78 in the common leg. $V_{DD}$ is coupled to the gate of transistor 75. Note that the arrangement of transistors 70, 71, 74, 76 and 75 are arranged equivalently as transistors 60, 61, 64, 67 and

65, with one notable exception. The $CLK_p$ and $CLK_n$ inputs are reversed in the dummy AND gate portion 52. A purpose of the dummy gate 52 is to provide a dummy loading effect, so that symmetric and/or balanced loading conditions to the $CLK_p$ and $CLK_n$ inputs are present regardless of the state of the data signal. The dummy loading helps in reducing data dependent jitter in the RZ mode that may be caused by clock feedthrough and/or load mismatch. The dummy loading may have substantially the same loading effect as the AND gate portion 51 or may be scaled to prevent excessive capacitive loading to the data path, as well as to reduce power consumption. In one embodiment, dummy gate 52 is scaled to one-fifth that of AND gate 51. Other scaling factors may be used in other embodiment.

As was noted with the AND gate, the dummy gate portion 52 may vary in other embodiments. For example, transistor 75 may not be present in some embodiments. Still in another embodiment, load 77 may not be present, in which case the drain of transistor 75 would be coupled to the drain of transistor 71. Still in another embodiment, load 77 and transistor 75 may not be present, in which case the drain of transistor 76 would be coupled to the drain of transistor 71. Still other example may be implemented.

Figure 8:
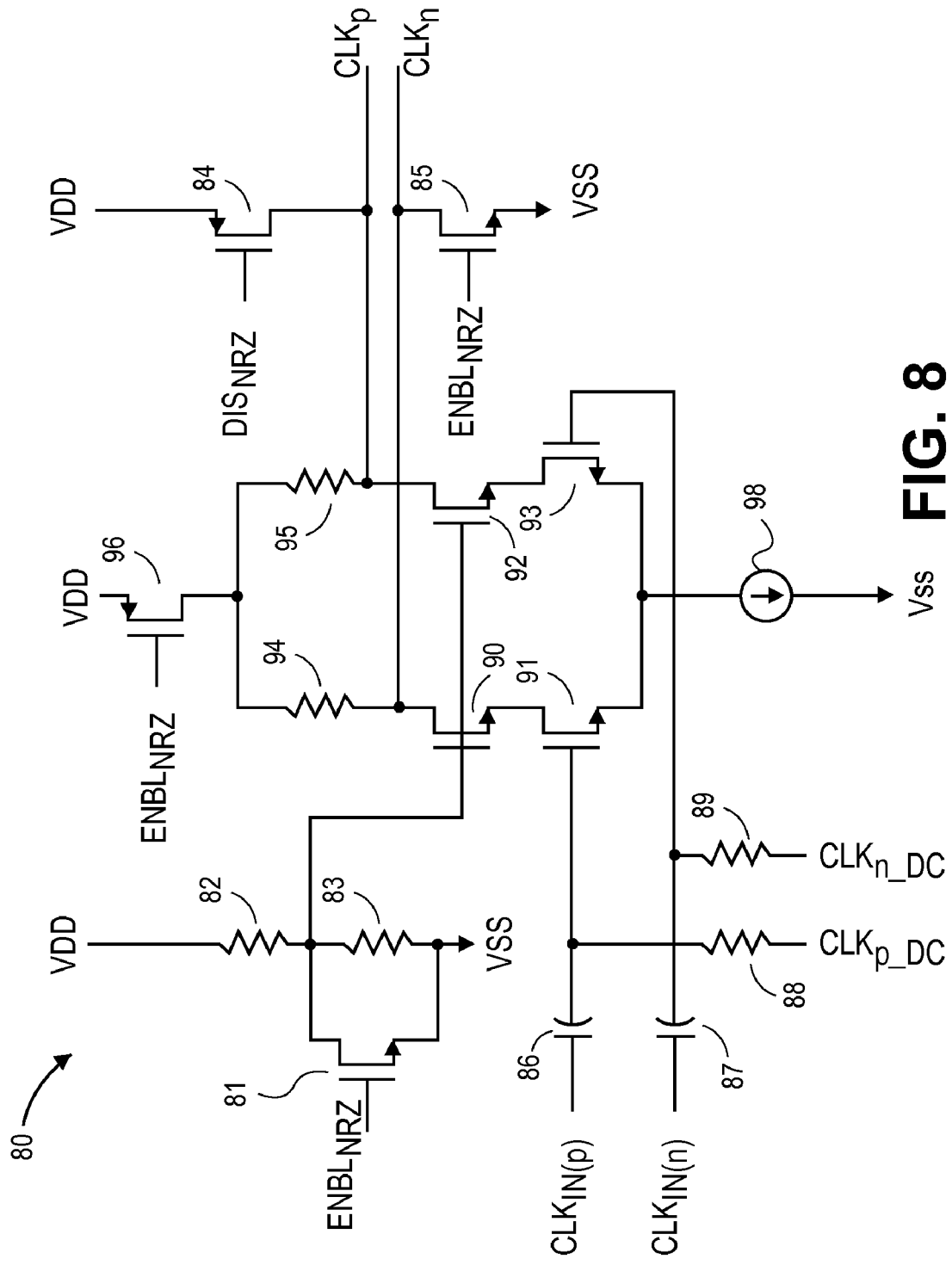
FIG. 8 is an example circuit schematic for implementing a clock buffer that decouples a clock signal when the output driver is selected for generating the NRZ output from the output driver.

FIG. 8 shows a schematic of a circuit 80 that is used for clock buffer 38. Circuit 80 illustrates just one embodiment that may be implemented within circuit 40. Circuit 80 comprises differentially arranged clock input transistors 91, 93, with respective cascode transistors 90, 92, coupled to respective loads 94, 95. The input clock signals are differential and shown coupled to respective gates of transistors 91, 93, as signals $CLK_{IN(p)}$ and $CLK_{IN(n)}$. The $CLK_{IN(p)}$ and $CLK_{IN(n)}$ clock inputs correspond to the delay/phase adjusted (and duty-cycle adjusted, when used) clock signal inputs to clock buffer 38. These clock inputs are coupled through respective capacitors 86, 87. The sources of transistors 91, 93 are coupled to $V_{SS}$ via current source 98 in the common leg. The loads 94, 95 are coupled to $V_{DD}$ through transistor 96. The buffered clock signals $CLK_p$ and $CLK_n$ to the AND gate logic circuit 50 are obtained as outputs from respective drains of transistors 92, 90.

Also shown in circuit 80 is a NRZ/RZ selection signal that may correspond to the SEL signal noted in FIGS. 1 and 3. An NRZ enabling signal $ENBL_{NRZ}$ is active when in the NRZ mode and NRZ disable signal $DIS_{NRZ}$ is active when in the RZ mode. A transistor 81 is coupled across resistance 83 of a voltage divider network of resistances 82, 83, wherein the drain of transistor 81 is coupled to the node connection of resistances 82 and 83, which is then coupled to the gates of transistors 90, 92 to provide gate bias for transistors 90, 92. The $CLK_p$ and $CLK_n$ output lines are coupled to VDD and VSS through respective pull-up transistor 84 and pull-down transistor 85.

The $ENBL_{NRZ}$ select signal is coupled to gates of transistors 81, 96 and 85 and the disable NRZ signal, $DIS_{NRZ}$ (which may be a complement of $ENBL_{NRZ}$), is coupled to the gate of transistor 84. $ENBL_{NRZ}$ is "high" in the NRZ mode and "low" in the RZ mode. The $DIS_{NRZ}$ signal is just the opposite. The transistors shown are n-type MOS (metal-oxide semiconductor) transistors, except for transistors 84 and 96, which are p-type MOS transistors. In the RZ mode of operation, the clock buffer circuit 80 is active to pass through the $CLK_{IN(p)}$ and $CLK_{IN(n)}$ clock signals to output the $CLK_p$ and $CLK_n$ signals. $ENBL_{NRZ}$ is low in the RZ mode ($DIS_{NRZ}$ is high), so that transistor 81 is off and a high voltage bias is placed on the gates of transistors 90, 92 to turn on transistors 90, 92. Since $ENBL_{NRZ}$ is "low", p-type transistor 96 conducts placing the buffer in operation. The "low" $ENBL_{NRZ}$ signal on the gate of transistor 85 and the "high" $DIS_{NRZ}$ signal on the gate of p-type transistor 84, keeps these two transistors 84, 85 off. Thus, $CLK_n$ and $CLK_p$ buffered outputs are obtained from input clock signals $CLK_{IN(p)}$ and $CLK_{IN(n)}$, when in the RZ mode.

In the NRZ mode, $ENBL_{NRZ}$ is "high" and $DIS_{NRZ}$ is "low", so that transistor 81 is turned on to place a low voltage bias on the gates of transistors 90, 92 and transistor 96 is turned off to remove $V_{DD}$. However, transistors 84 and 85 are now turned on, so that high voltage state (near $V_{DD}$) is placed on the $CLK_p$ line and a low voltage state (near $V_{SS}$) is placed on the $CLK_n$ line, via a path provided through loads 95, 94. Thus, fixed differential states are generated on the $CLK_p$ and $CLK_n$ lines as the fixed second input to AND gate 43 in the NRZ mode. By pulling down the cascode node at the drain of transistor 81, the clock buffer is turned off by decoupling the clock signals $CLK_{IN(p)}$ and $CLK_{IN(n)}$ from the output lines $CLK_p$ and $CLK_n$, which helps to reduce output periodic jitter in the NRZ mode.

It is to be noted that the switching on and off of the clock buffer circuit is used in the embodiment described above to switch between the RZ and NRZ modes. When the clock buffer is turned on, the clock signal is coupled through as an input to the AND gate to operate in the RZ mode. However, when the clock buffer is turned off (powered down), the clock signal is decoupled and a predetermined state is placed at the output of the clock buffer for coupling to the AND gate in the NRZ mode. Furthermore, as noted above, the operative functions of the clock buffer may be incorporated in the AND gate or other circuitry.

Also shown in FIG. 8 are DC bias signals $CLK_{p\_DC}$ and $CLK_{n\_DC}$, which are respectively coupled to gates of transistors 91, 93 through respective resistances 88, 89. The biasing voltage may be adjusted to set the DC bias of transistors 91, 93, which changes the duty-cycle in response. This bias adjustment is used to set the duty cycle of the buffered clock signal. In the shown embodiment of FIG. 8, the duty cycle circuit is implemented as a high pass filter on each of the p and n sides of the incoming differential $CLK_{IN(p)}$) and $CLK_{IN(n)}$ signals. Adjusting the common-mode voltages relative to each side provides the duty cycle adjustment.

Figure 9:
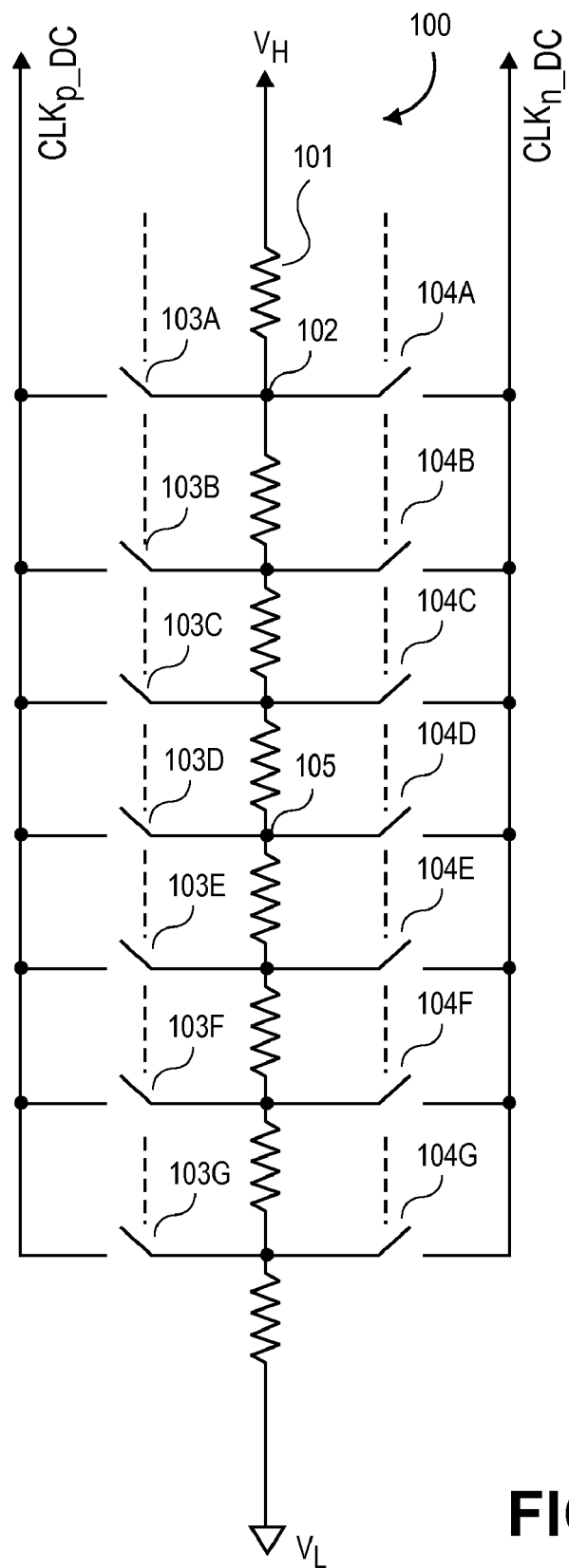
FIG. 9 is an example resistor ladder circuit that is used to adjust the common-mode voltage in order to vary the duty-cycle when in the RZ mode of operation.

Although various techniques may be used to vary the DC bias of $CLK_{p\_DC}$ and $CLK_{p\_DC}$, one embodiment for providing $CLK_{p\_DC}$ and $CLK_{n\_DC}$ is shown in FIG. 9. FIG. 9 shows a circuit 100 that uses a resistor ladder comprised of a plurality of resistors 101 coupled across potentials $V_H$ and $V_L$. In one embodiment, $V_H$ may be $V_{DD}$ and $V_L$ may be $V_{SS}$. A node 102 is formed at various junctures of resistors 101. Switches 103 couple each corresponding node 102 to the $CLK_{p\_DC}$ line. Likewise, switches 104 couple each corresponding node 102 to the $CLK_{n\_DC}$ line. The resistor ladder operates as a voltage divider network, so that by closing a particular switch 103, a particular voltage is placed on the $CLK_{p\_DC}$ line. Likewise, by closing a particular switch 104, a particular voltage is placed on the $CLK_{n\_DC}$ line and the difference in the voltage provides the common-mode offset. A node 105 is selected as a midpoint node, which is then used to provide a reference point for having a 50%-50% duty-cycle.

In operation, for 50%-50% duty-cycle selection, switches 103D and 104D at midpoint node 105 are closed, placing the same potential on the $CLK_{p\_DC}$ line and the $CLK_{n\_DC}$ line. When the duty-cycle is to be adjusted, the switch closures are changed, so that as the switch closure on one side of the ladder moves up or down in a given direction, a switch closure on the other side of the ladder moves correspondingly in the opposite direction. Thus, when the duty-cycle is to be set at 50%-50%, node 105 is selected and switches 103D and 104D are closed. When the duty cycle is to be adjusted in one direction, switches 103C and 104E are closed. If further duty-cycle separation is to be achieved, switches 103B and 104F can be closed, and so forth. Alternatively, if the duty-cycle adjustment is to be in the opposite direction, switches 103E and 104C can be closed, and so forth. Thus, by selecting which corresponding pairs of switches are to be closed at any given time, voltages on the $CLK_{p\_DC}$ and $CLK_{n\_DC}$ lines may be varied to adjust the common-mode voltage and the offset. It is to be noted that the number of resistors 101 in the resistor ladder, along with switches 103, 104, or the values of resistors 101 are a design choice. Clearly, by having more resistors and switches present, granularity for selecting the different duty-cycles is increased. Furthermore, although a plurality of resistors 101 are shown, other embodiments may use other components.

However it is done, circuit 80 of FIG. 8 provides the outputs $CLK_n$ and $CLK_p$ with the desired pulsewidths. When the common-mode voltage is approximately the same, the duty cycle is at approximately 50%-50%. The percentages vary plus or minus as the common-mode voltage varies correspondingly between the two inputs when in the RZ mode.

It is to be noted that a variety of other techniques may be implemented for duty cycle control. Instead of the shown single stage buffer, a cascade of stages may be used, in which duty cycle adjustment may be distributed over multiple buffer stages. Thus, duty-cycle adjustment may be achieved by changing the DC value of the clock signal ($CLK_{IN(p)}$ and $CLK_{IN(n)}$ at one or both of the input terminal(s) of the clock buffer.

Accordingly, a high speed, low-power, NRZ/RZ output driver is described, in which circuit redundancy and power consumption may be reduced by having one output driver generate both NRZ and RZ outputs. Although the output driver is described in various embodiments above, other embodiments may be readily implemented for practicing the invention. Thus, complementary MOS (CMOS) and current mode logic (CML) structures may be used to implement the output driver. Other technologies may be used as well. Circuit components and structure are presented as examples and other structures, devices and components may be readily implemented to practice the invention. For example, as noted above, p-type transistors may be used in place of load resistors. Furthermore, although the example embodiments are shown using NMOS implemented circuitry, equivalent circuitry may be obtained using PMOS techniques.

As may be used herein, the terms "substantially" and "approximately" provides an industry-accepted tolerance for its corresponding term and/or relativity between items. Such an industry-accepted tolerance ranges from less than one percent to fifty percent. Such relativity between items ranges from a difference of a few percent to magnitude differences. As may also be used herein, the term(s) "coupled" and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items.

The embodiments of the present invention have been described above with the aid of functional building blocks illustrating the performance of certain functions. The boundaries of these functional building blocks have been arbitrarily defined for convenience of description. Alternate boundaries could be defined as long as the certain functions are appropriately performed. One of ordinary skill in the art may also recognize that the functional building blocks, and other illustrative blocks, modules and components herein, may be implemented as illustrated or by discrete components, application specific integrated circuits, processors executing appropriate software and the like or any combination thereof.

We claim:

1. An apparatus comprising:
   a driver module to receive a non-return-to-zero (NRZ) input signal and to provide an NRZ output signal or to convert the NRZ input signal to generate a return-to-zero (RZ) output signal; and
   a select module coupled to the driver module to select between a NRZ mode of operation or a RZ mode of operation for the driver module to respectively generate the NRZ output signal or the RZ output signal, wherein the select module to receive a clock signal and to couple the clock signal to the driver module to select the RZ mode of operation and to decouple the clock signal from the driver module to select the NRZ mode of operation.

2. The apparatus of claim 1, further comprising a phase adjustment module coupled to adjust a phase of the clock signal to phase align the clock signal and the NRZ input signal.

3. The apparatus of claim 2, further comprising a duty cycle adjustment module to adjust a duty cycle of the clock signal coupled to gate the NRZ input signal to adjust a duty cycle of the RZ output signal.

4. The apparatus of claim 2, wherein the phase adjustment module includes a delay module to provide a fixed delay to delay the clock signal and a phase interpolator to provide variable phase adjustment to shift the clock signal in order to adjust the phase of the clock signal.

5. The apparatus of claim 1, wherein the driver module includes a logical AND gating module to pass through the NRZ input signal when in the NRZ mode of operation and to gate the NRZ input signal based on the clock signal to convert the NRZ input signal to the RZ output signal when in the RZ mode of operation.

6. The apparatus of 5, wherein the clock signal is a differential clock signal and the driver module further includes a dummy logical AND gating module to provide dummy loading for the differential clock signals.

7. An apparatus comprising:
   a gating logic to receive a non-return-to-zero (NRZ) input signal and to couple the NRZ input signal as an NRZ output signal when operating in a NRZ mode of operation and to convert the NRZ input signal to a return-to-zero (RZ) output signal when operating in a RZ mode of operation; and
   a clocking circuit to couple a clock signal to gate the gating logic to convert the NRZ input signal to the RZ output signal in the RZ mode of operation, the clocking circuit to decouple the clock signal and couple a predetermined signal state to the gating logic when in the NRZ mode of operation, and the clocking circuit to receive a select signal to select between the NRZ and RZ modes of operation by coupling or decoupling the clock signal to the gating logic to switch between the NRZ and RZ modes of operation.

8. The apparatus of claim 7, further comprising a phase adjustment module coupled to adjust a phase of the clock signal to phase align the clock signal and the NRZ input signal to generate the RZ output signal.

9. The apparatus of claim 8, wherein the phase adjustment module adjusts the phase of the clock signal to phase align the clock signal and the NRZ input signal to generate a phase aligned clock output signal along with the NRZ output signal.

10. The apparatus of claim 8, further comprising a duty cycle adjustment module to adjust a duty cycle of the clock signal coupled to gate the NRZ input signal to adjust a duty cycle of the RZ output signal, in which the duty cycle adjustment is obtained by adjusting an offset voltage.

11. The apparatus of claim 8, wherein the phase adjustment module includes at least one delay element to provide a fixed delay to delay the clock signal and a phase interpolator to provide variable phase adjustment to shift the clock signal in order to adjust the phase of the clock signal.

12. The apparatus of claim 8, wherein the gating logic includes a logical AND gate that receives the NRZ input signal as a first input, in which the clock signal is coupled as a second input to the logical AND gate to gate the logical AND gate when in the RZ mode of operation and the predetermined signal state is coupled to the second input of the logical AND gate to pass through the NRZ input signal when in the NRZ mode of operation.

13. The apparatus of claim 12 wherein the clock signal is a differential clock signal and the gating logic includes a dummy logical AND gate to provide balanced loading for the differential clock signals.

14. The apparatus of claim 7, further comprising a phase adjustment module coupled to adjust a phase of the clock signal to phase align the clock signal and the NRZ input signal to generate the RZ output signal and a duty cycle adjustment module to adjust a duty cycle of the clock signal coupled to gate the NRZ input signal to adjust a duty cycle of the RZ output signal, wherein the phase adjustment module includes at least one delay element to provide a fixed delay to delay the clock signal and a phase interpolator to provide variable phase adjustment to shift the clock signal in order to adjust the phase of the clock signal.

15. A method comprising:
receiving a non-return-to-zero (NRZ) input signal at a gating logic;
receiving a clock signal at a clocking circuit;
selecting between a NRZ mode of operation and a return-to-zero (RZ) mode of operation for the clocking circuit;
coupling the clock signal through the clocking circuit in order to gate the gating logic to convert the NRZ input signal to a RZ output signal when the RZ mode of operation is selected, and decoupling the clock signal and placing a predetermined signal state at the gating logic when the NRZ mode of operation is selected; and
gating through the NRZ input signal as an NRZ output signal when the NRZ mode of operation is selected and converting the NRZ input signal to a RZ output signal when the RZ mode of operation is selected.

16. The method of claim 15 further including adjusting a phase of the clock signal prior to coupling the clock signal to the gating logic.

17. The method of claim 15 further including adjusting a duty cycle of the clock signal prior to coupling the clock signal to the gating logic.

18. The method of claim 15 wherein the gating logic includes an logical AND gate to pass through the NRZ input signal as the NRZ output signal and convert the NRZ input signal to the RZ output signal, wherein the gating logic includes a dummy logical AND gate to provide balanced loading to compensate for loading by the AND logic gate, the method further comprising coupling the clock signal to both the logical AND gate and the dummy logical AND.

* * * * *

UNITED STATES PATENT AND TRADEMARK OFFICE
CERTIFICATE OF CORRECTION

| | | |
|---|---|---|
| PATENT NO. | : 7,973,681 B2 | Page 1 of 1 |
| APPLICATION NO. | : 12/567841 | |
| DATED | : July 5, 2011 | |
| INVENTOR(S) | : Adesh Garg et al. | |

It is certified that error appears in the above-identified patent and that said Letters Patent is hereby corrected as shown below:

Col. 10, line 50, in claim 6: after "the apparatus of" insert --claim--
Col. 12, line 30, in claim 18: replace "an logical" with --a logical--

Signed and Sealed this
Twenty-seventh Day of November, 2012

David J. Kappos
*Director of the United States Patent and Trademark Office*